(12) United States Patent
Ge et al.

(10) Patent No.: US 10,162,263 B2
(45) Date of Patent: Dec. 25, 2018

(54) DYNAMIC LOGIC MEMCAP

(71) Applicant: HEWLETT-PACKARD DEVELOPMENT COMPANY, L.P., Houston, TX (US)

(72) Inventors: Ning Ge, Palo Alto, CA (US); Zhiyong Li, Palo Alto, CA (US); Jianhua Yang, Amherst, MA (US); R. Stanley Williams, Portola Valley, CA (US)

(73) Assignee: HEWLETT-PACKARD DEVELOPMENT COMPANY, L.P., Houston, TX (US)

( * ) Notice: Subject to any disclaimer, the term of this patent is extended or adjusted under 35 U.S.C. 154(b) by 0 days.

(21) Appl. No.: 15/547,105

(22) PCT Filed: Apr. 27, 2015

(86) PCT No.: PCT/US2015/027767
§ 371 (c)(1),
(2) Date: Jul. 28, 2017

(87) PCT Pub. No.: WO2016/175742
PCT Pub. Date: Nov. 3, 2016

(65) Prior Publication Data
US 2018/0017870 A1    Jan. 18, 2018

(51) Int. Cl.
*H01L 27/00* (2006.01)
*H01L 45/00* (2006.01)
(Continued)

(52) U.S. Cl.
CPC .............. *G03F 7/16* (2013.01); *B41J 2/0458* (2013.01); *B41J 2/04541* (2013.01);
(Continued)

(58) Field of Classification Search
CPC ............ G11C 2213/15; G11C 2213/32; G11C 2213/31; G11C 13/0023; G11C 13/0007; G11C 13/0069; G11C 13/0004; H01L 27/2436; H01L 27/2463; H01L 45/08; H01L 45/1233; H01L 45/167;
(Continued)

(56) References Cited

U.S. PATENT DOCUMENTS 6,818,936 B2   11/2004   Lin et al.
7,566,628 B2    7/2009   Liao et al.
(Continued)

OTHER PUBLICATIONS

Brenna, S., et al., Analysis and Optimization of a SAR ADC with Attenuation Capacitor, May 26-30, 2014, MIPRO, pp. 68-73.
(Continued)

*Primary Examiner* — Nikolay Yushin
(74) *Attorney, Agent, or Firm* — HP Inc. Patent Department

(57) ABSTRACT

An integrated circuit may include a substrate with a plurality of transistors formed in the substrate. The plurality of transistors may be coupled to a first metal layer formed over the plurality of transistors. A plurality of high dielectric nanometer capacitors may be formed of memristor switch material between the first metal layer and a second metal layer formed over the plurality of high dielectric capacitors. The plurality of high dielectric capacitors may operate as memory storage cells in dynamic logic.

16 Claims, 6 Drawing Sheets

(51) Int. Cl.
*G03F 7/16* (2006.01)
*G11C 13/00* (2006.01)
*G11C 19/28* (2006.01)
*B41J 2/045* (2006.01)
*B41J 2/14* (2006.01)
*H01L 27/108* (2006.01)
*H01L 49/02* (2006.01)
*H01L 27/24* (2006.01)

(52) U.S. Cl.
CPC ....... *B41J 2/04543* (2013.01); *B41J 2/14129* (2013.01); *G11C 13/0007* (2013.01); *G11C 13/0069* (2013.01); *G11C 19/28* (2013.01); *H01L 27/10817* (2013.01); *H01L 27/2436* (2013.01); *H01L 27/2463* (2013.01); *H01L 28/87* (2013.01); *H01L 28/91* (2013.01); *H01L 45/08* (2013.01); *H01L 45/1233* (2013.01); *H01L 45/1675* (2013.01); *H01L 45/1683* (2013.01); *B41J 2202/13* (2013.01); *G11C 13/0023* (2013.01); *G11C 2213/15* (2013.01); *G11C 2213/31* (2013.01); *G11C 2213/32* (2013.01); *H01L 45/146* (2013.01); *H01L 45/147* (2013.01)

(58) Field of Classification Search
CPC ............... H01L 45/1683; H01L 45/146; H01L 45/147; H01L 28/87; H01L 28/91; H01L 28/55; H01L 28/24; B41J 2/04541; B41J 2/0458; B41J 2/14129; B41J 2/04543; B41J 2202/13
See application file for complete search history.

(56) References Cited

U.S. PATENT DOCUMENTS

| | | | |
|---|---|---|---|
| 7,778,063 B2* | 8/2010 | Brubaker | H01L 27/2409 365/148 |
| 7,830,203 B2 | 11/2010 | Chang et al. | |
| 8,178,404 B2 | 5/2012 | Olewine et al. | |
| 8,416,609 B2* | 4/2013 | Meade | H01L 27/101 365/149 |
| 8,537,591 B2* | 9/2013 | Kim | G11C 13/0007 365/148 |
| 8,891,276 B2* | 11/2014 | Siau | G11C 5/06 365/148 |
| 8,987,702 B2* | 3/2015 | Mouli | H01L 27/1021 257/30 |
| 2006/0216877 A1 | 9/2006 | Toyota et al. | |
| 2008/0106926 A1* | 5/2008 | Brubaker | H01L 27/2409 365/148 |
| 2008/0272363 A1* | 11/2008 | Mouli | H01L 27/1021 257/14 |
| 2010/0109744 A1 | 5/2010 | Czech et al. | |
| 2011/0051310 A1 | 3/2011 | Strachan et al. | |
| 2011/0199814 A1* | 8/2011 | Meade | H01L 27/101 365/149 |
| 2011/0310652 A1* | 12/2011 | Kim | G11C 13/0007 365/148 |
| 2012/0314468 A1* | 12/2012 | Siau | G11C 5/06 365/66 |
| 2013/0208532 A1 | 8/2013 | Meade | |
| 2014/0027705 A1 | 1/2014 | Yang et al. | |
| 2015/0053909 A1 | 2/2015 | Yang et al. | |

OTHER PUBLICATIONS

Qingjiang, L., et al., Memory Impedance in Tio2 Based Metal-insulator-metal Devices, Mar. 31, 2014, Scientific Reports, vol. 4, Article No. 4522, 9 pages.

Shi-Jin, D., et al., High Density Al2O3/TaN-based Metal-insulator-metal Capacitors in Application to Radio Frequency Integrated Circuits, Sep. 2007, Chinese Physics, vol. 16 No. 9 pp. 1009-1963.

* cited by examiner

DYNAMIC LOGIC MEMCAP

BACKGROUND

Most integrated circuit research and development is often devoted to "shrinking the lithography," namely, minimizing the line width and spacing of lines on the optical masks used to create the integrated circuits. By shrinking the lithography, more integrated circuits can be created on a semiconductor substrate while increasing the performance of the integrated circuit, despite the fact that the power and voltage requirements may also be lowered.

BRIEF DESCRIPTION OF THE DRAWINGS

The claimed subject matter can be understood with reference to the following drawings. Like reference numerals designate corresponding similar parts through the several views.

DETAILED DESCRIPTION

Figure 1:
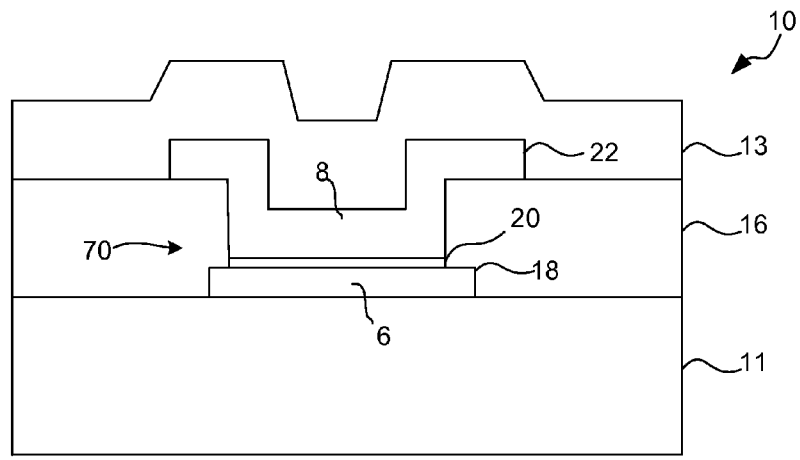
FIG. 1 is a cross-section of an example memcap.

There remain many applications, such as with printheads and sensors, which require high voltages due to required energy prerequisites and the need to keep operating currents low to prevent power loss and metal migration. As a result, printhead and sensor manufacturers have typically stayed with older semiconductor processes as it can be difficult to implement such devices with the newer shrunken lithographic processes. Market forces are demanding faster printhead operation. Yet, the difficulty of implementing printheads with shrunken processes, much less the considerable testing, characterization, and qualification of such shrunken processes would necessitate, requires that a different approach be sought.

Rather than shrinking an entire lithographic processes, the claimed subject matter can be directed at improving performance and reducing the die size by minimizing components which require large area on a semiconductor die. One such component may be a memory capacitor used in dynamic logic. Dynamic logic differs from traditional static logic in that it may require continual non-overlapped clocking to pre-charge and discharge memory capacitors (also known as memory nodes or memory storage cells) that temporarily hold the state of digital logic performing various functions such as state machines, counters, shift registers, ring memories, bucket brigades, etc. Traditional memory capacitors may be implemented using a capacitor formed using a polysilicon gate electrode as one capacitor plate, a silicon dioxide gate oxide as the capacitor dielectric, and the substrate gate channel as the other capacitor plate. Dynamic logic can be traditionally found in single polarity semiconductors, such as NMOS and PMOS but it may also be used sometimes with CMOS when space constraints require it and circuit timing allows for its use.

One particular insight relating to the claimed subject matter can be that rather than using a transistor gate's oxide for the capacitor, a new high quality capacitor may be created with minor changes to existing IC fabrication processes. These minor changes may allow for the continued use of existing mature, high yielding, and high voltage process technology while also possibly allowing for a shrink of the actual laid out area of the circuitry along with increased circuit performance. Thus, many of the benefits of a shrunken lithographic process can be achieved with the claimed subject matter while keeping the desirable features of the conventional IC process. These benefits may come without incurring the cost and development of a new IC process, the acquisition of new fabrication equipment, and the extended time required for lengthy characterization, testing, and qualification of a new process.

The new high quality memory capacitor (memcap) for memory storage cells may be formed by modifying a via mask to additionally define openings in an insulator layer to a first metal layer to create a first plate of the new memcap and then growing or depositing a high quality dielectric layer on the exposed first metal layer, which may be used as the new capacitor high-k dielectric. A transition metal layer can be applied to provide good contact to the high quality dielectric and to a later applied metal mask, thereby creating the second plate of the new memcap. A new mask may then be used to expose the normal via openings and not expose the memcap openings. An etch process may then be used to remove the high quality dielectric layer to allow for direct contract to the first metal layer within via openings. The new mask may be removed and a metal layer may then be applied to the IC to allow for contact with the memcap and vias. Additional process steps can be added to enhance the function/capability of the memcap dielectric to give or enhance memristor properties as will be explained in more detail below.

This insight may result in a new memcap that requires only one new mask, a thin-film deposition for the high-k dielectric of the memcap, a new etching step for the traditional process, and possibly a thin-film deposition for the transition metal layer if desired. By making this minimal change to the process, the speed of operation of the printhead can be improved and the size of the dynamic logic can be reduced while maintaining the benefits of the current lithography process, such as relative high voltage and high current operation. Additional steps, such as adding oxygen or nitrogen vacancies within the memcap dielectric, respectively, can allow the memcap to also have memristor functionality. Thin-film deposition can occur using one or more of oxidation, ALD (Atomic layer deposition), PVD (physical vapor deposition), PECVD (plasma-enhanced chemical vapor deposition), and SOG (spin-on-glass).

The speed and smaller size improvements may be achieved by having the memcap dielectric be a much thinner thickness than the gate oxide used in traditional memcap devices. Further, by choice of materials in forming the memcap high quality dielectric, the dielectric constant of the capacitor can be greatly increased thereby allowing for further reduction in memcap area. The higher quality of dielectric material and overall memcap design may allow for less leakage as compared to traditional memcaps fabricated with gate dielectric. Less leakage current may allow for a smaller capacitance value to be used in the circuit, and thus less time may be needed to pre-charge the capacitor during use. Also, traditional gate based capacitors may have had one plate inherently connected to substrate bulk, which would be ground with NMOS or VPP (peak-to-peak voltage) for PMOS. With the new memcap design, either capacitor plate can be connected to other circuitry as desired, allowing for more freedom of design.

A "memcap" may be considered a subset of a "memcapacitor". A "memcapacitor" can be designed to remain capacitive over its range of operating voltage yet its capacitance value may be allowed to be variable with respect to the operating voltage. On the other hand, a "memcap" can be designed to be a high quality capacitor (having a very high parallel resistance) in one high quality capacitor operating voltage region and a low quality capacitor (having a low but programmable parallel resistance) in a low quality capacitor operating voltage region. Generally, the capacitance of the "memcap" in the high quality capacitor region may have little capacitance value variability with respect to the operating voltage. Any potential capacitance value variability in the high quality capacitor operating region can be compensated for by simply increasing the capacitance value. In the low quality capacitor region, the capacitance value may be typically overwhelmed by the low parallel resistance and the device may perform more as a memristor and not a capacitor as any charge on the capacitor may be quickly discharged.

The semiconductor devices of the present claimed subject matter may be applicable to a broad range of semiconductor devices technologies and can be fabricated from a variety of semiconductor materials. The following description discusses several examples of the semiconductor devices of the present claimed subject matter as implemented in silicon substrates, since the majority of currently available semiconductor devices may be fabricated in silicon substrates and the most commonly encountered applications of the present claimed subject matter may involve silicon substrates. Nevertheless, the present claimed subject matter may also advantageously be employed in gallium arsenide, germanium, and other semiconductor materials such as metal oxide semiconductors. Accordingly, the present claimed subject matter is not intended to be limited to those devices fabricated in silicon semiconductor materials, but may include those devices fabricated in one or more of the available semiconductor materials and technologies available to those skilled in the art, such as thin-film-transistor (TFT) technology using polysilicon on glass substrates. Moreover, heavily doped regions (typically concentrations of impurities of at least $1 \times 10^{19}$ impurities/cm$^3$) may be designated by a plus sign (e.g., $N^+$ or $P^+$) and lightly doped regions (typically concentrations of no more than about $5 \times 10^{16}$ impurities/cm$^3$) by a minus sign (e.g. $P^-$ or $N^-$).

It should be noted that the drawings may not be true to scale. Further, various parts of the active elements may not have been drawn to scale. Certain dimensions may have been exaggerated in relation to other dimensions in order to provide a clearer illustration and understanding of the present claimed subject matter.

Moreover, while the present claimed subject matter may be illustrated by examples directed to fluidic devices, it is not intended that these illustrations be a limitation on the scope or applicability of the present claimed subject matter as fluidic devices may be just one example; sensors, memories, and analog circuitry being some others. Further, it is not intended that the fluidic devices of the present claimed subject matter be limited to the physical structures illustrated. These structures have been included to only demonstrate the utility and application of the present claimed subject matter by way of examples.

A planer plate capacitor with certain fixed dielectric has its capacitance directly proportional to the plate area and relative dielectric constant of the dielectric and inversely proportional to the thickness of the dielectric. That is, $$C = \epsilon_r \epsilon_o A / t$$

where $\epsilon_r$=relative static permittivity, $\epsilon_o$=vacuum permittivity, A=plate area, and t=dielectric thickness.

An example of a traditional thin-film stack for a printhead process may have the following specifications:

TABLE 1

Example Conventional Thin-film Stack for Printhead

| Layer | Thickness (Angstroms) | Material | $\epsilon_r$ | Mask Name |
|---|---|---|---|---|
| Gate Oxide | 750 | SiO2 | ~5 | |
| Poly Gate | 4800 | Polysilicon | | gate |
| Insulator 1 | 10000 | PSG/undoped oxide | 3.9 | Contact, substrate contact (optional) |
| Metal 1 | 5000 | AlCu | | Metal1, metal etch |
| Insulator 2 | 10000 | TEOS | 3.9 | via |
| Metal 2 | 8000 | TaAl/AlCu | | metal 2 and sloped metal etch |
| Passivation | 3850 | SiC/Si$_3$N$_4$ | 7.6 | Via1, cavitation |

As can be seen, the 750 Angstrom thickness of the gate oxide may be the thinnest material of the conventional thin-film stack. Also, only the passivation layer of SiC/Si$_3$N$_4$ has a higher dielectric constant and may only contact one metal layer. It may also be difficult to decrease the memcap area A, since a typical gate oxide capacitor may have an overlap with source and drain regions and typically there may be current leakage in the capacitor due to the side wall and overlap region construction. The gate oxide may have some N+ or P+ doping and thus may have varying dielectric constant across its length. The claimed subject matter creates a new memcap that can be of much higher quality and also more flexible in its design and performance as will be explained in the description below.

Figure 2:
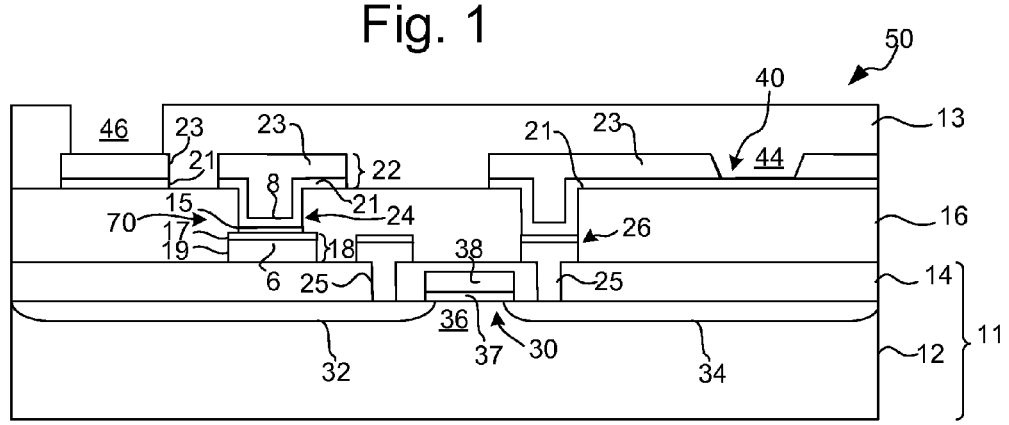
FIG. 2 is a cross-section of an example fluidic printhead die with an example memcap.

FIG. 1 is a cross-section of an example integrated circuit (IC) 10 having an example memcap 70 utilizing the claimed subject matter. A substrate base 11 has a first metal layer 18 disposed on it. The substrate base may be a substrate 12 of silicon (FIG. 2) with one or more transistors formed within the substrate 12 and may include a first insulator layer 14 (FIG. 2). First metal layer 18 may be composed of one or more layers of one or more metals or alloys to form a first plate 6. For instance in one example, first metal layer 18 may be made of an alloy or layers of copper (Cu) and aluminum (Al) disposed on it. The Cu layer allows for electrical metal migration mitigation. The Cu content of the first metal layer 18 may be 0.5% to 1.5% in some examples and can vary more depending on the particular application. Also, the Al can have a very thin oxide growth, such as 50 to 1000 Angstroms (5 to 100 nanometer scale) of AlO$_x$ or other material, to define more generically an active region of MSM (Memristor Switch Material) 20 as will be discussed later. This thin nanometer scale dielectric growth may be a high quality dielectric with a relative dielectric constant of around 9 (AlO$_x$) to around 60 (TiO$_2$) depending on the materials used. A second insulator layer 16 surrounds the first metal layer 18 and the MSM 20 dielectric layer of memcap 70 and may be etched to form an opening to the MSM 20 dielectric layer. A second metal layer 22 may be deposited in the opening to form a second plate 8 of the memcap 70. The second metal layer 22 may be formed of one or more metal layers such as a layer of Al to contact the memcap oxide followed by a layer of Cu for conductivity followed by a layer of Al for protecting the Cu followed by a layer of Tantalum (Ta) for hardness. Other metal layers could be used depending on the design and desired characteristics. Finally, a passivation layer 13 may be placed over the previous layers to protect the thin-film stack and semiconductor substrate from contamination.

Compared to a conventional thin-film stack gate oxide capacitor, the capacitor area of the memcap 70 capacitor using $AlO_x$ for MSM 20 can be reduced by about 27 times less area:

$$\frac{A_{old}}{A_{new}} = \frac{\epsilon_{new}}{\epsilon_{old}} \frac{t_{old}}{t_{new}} = \frac{9}{5} \frac{750}{50} = 27$$

This significantly reduces the circuitry area and since there may be little dielectric current leakage due to the high quality of $AlO_x$ dielectric, the memcap 70 area can be reduced even further, allowing for a smaller capacitance value and accordingly there may be less charge up or pre-charge time and faster operation of the circuitry. This capacitance value reduction may result in a reduction of the periodic clock cycle time and correspondingly an increase in the system performance, such as printing speed with printers, memory read time with ring memories, or logic performance with state machines. In some examples, the memcap area may have an area less than 400 micro-meters$^2$.

FIG. 2 is a cross-section of an example fluidic printhead 50 die with an example memcap 70 embedded with a transistor 30 used to control power to an ejection element 40 and thin-film resistor 44. The substrate base 11 has a substrate 12 with diffused wells 32, 34 which may be used to form source and drains, respectively, of transistor 30. The substrate 12 may be doped lightly as an N$^-$ (PMOS or CMOS) or P$^-$ (NMOS or CMOS) and may include N$^+$ (NMOS or CMOS) or P$^+$ (PMOS or CMOS) wells or a combination of N$^+$ and P$^+$ wells such as for CMOS using a silicon on sapphire substrate. The wells may be more heavily doped as N$^+$ or P$^+$ depending on whether an N-type or P-type transistor, respectively, may be desired. A gate channel 36 may be formed between the two wells 32, 34 and a layer of gate oxide 37 may be disposed above the gate channel 36. A polysilicon layer 38 may be disposed on the gate oxide 37 to form the gate of the transistor 30. A first insulator layer 14 may be disposed over the substrate 12 and the polysilicon layer 38 that may form the gate. Shown are two contacts 25 which may fill openings in the first insulator layer 14 to allow a first sub-layer 19 of first metal layer 18 to contact the wells 32, 34, the source 24 and drain 26 of the transistor, respectively. Memcap 70 may be disposed over the first insulator layer 14 and first capacitor plate 6 may be defined by a pattern in the first metal layer 18 and may be composed of a first sub-layer 19 and a second sub-layer 17. A thin memcap MSM 20 layer may be formed on the first metal layer 18 and may contact a second metal layer 22 formed in a via opening 24 in the second insulator layer 16. A second via opening 26 in the second insulator layer 16 may allow the second metal layer 22 to contact the first metal layer 18 at the drain in well 34 of the transistor 30.

Second metal layer 22, as noted previously, may be made of one or more layers of different metals. For instance, an electrically resistive layer 21 may be used to lower conductivity of metal layer 22 for thin-film resistor 44 and a high conductive layer 23 may be used to protect the electrically resistive layer 21 from physical damage and contaminants during operation of printhead 50 and may also increase conductance. The second metal layer 22 may be disposed over the second insulator layer 16. A passivation layer 13 may be disposed over the thin-film stack to help protect it from fluids or ionic materials, however, it may have one or more openings 46 to allow access to the second metal layer 22 such as for IC bonding.

Accordingly, FIG. 2 is an example cross-section of a conventional integrated circuit (IC) that combines a transistor 30 and ejection element 40. The substrate 12 may have an ejection element 40 disposed over the substrate with an intervening second insulator layer 16, such as a field oxide layer, providing thermal isolation of the ejection element 40 to the substrate 12. Optionally, additional deposited oxide layers may be disposed on a field oxide layer to form the second insulator layer 16. The ejection element 40 may be coupled to a transistor 30, an N-MOS transistor in these examples, formed in the substrate 12. The coupling may be done using a first metal layer 18, such as aluminum, although other conductors can be used or in addition to, such as copper and gold. The transistor 30 may include a source active region in well 32 and a drain active region in well 34 and a gate 36.

The ejection element 40 may be made from a resistive electrically resistive layer 21 that may be deposited on the second insulator layer 16. The area of an opening of thin-film resistor 44 in the high conductive layer 23 using the slope metal etch mask may define the ejection element 40. To protect the ejection element 40 from the reactive qualities of fluid to be ejected, such as ink, a passivation layer 13 may be disposed over the ejection element 40 and other thin-film layers that have been deposited on the substrate 12. To create a printhead, the integrated circuit may be combined with an orifice layer (not shown) which may include a fluid barrier and an orifice plate. Optionally, the orifice layer can be a single or multiple layer(s) of polymer or epoxy material. Several methods for creating the orifice layer are known to those skilled in the art. The ejection element 40 and the passivation layer 13 may be protected from damage due to bubble collapse in fluid chamber after fluid ejection from a nozzle by a cavitation layer (not shown) that may be disposed over passivation layer 13. The stacks of thin-film layers that may be disposed on substrate 12 may be those layers processed on the substrate 12 before applying the orifice layer, which traditionally may be classified as thick-film layers.

Figure 3:
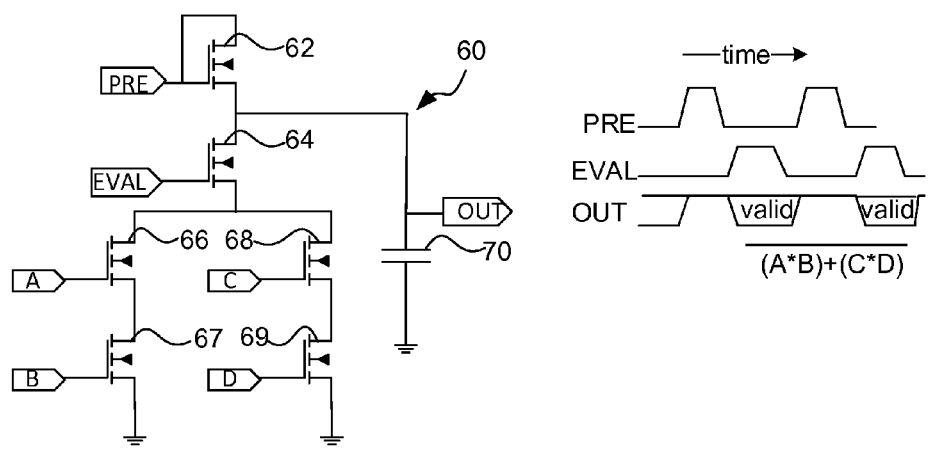
FIG. 3 is an example schematic of a dynamic logic circuit and timing which uses an example memcap.

FIG. 3 is an example schematic of a dynamic logic circuit 60 that may use an example memcap 70 and associated example timing. This dynamic logic circuit 60 may include one or more or a plurality of transistors that define the desired logic. The bulk connection for the transistors are shown unconnected but they may be connected to the respective source in some printheads and left floating in others. In this example, the transistors are NMOS transistors but they could be PMOS transistors or a combination of both depending on a particular desired logic circuit. For instance, transistors 66 and 67 are combined in a series arrangement to implement an AND Boolean function. Similarly, transistors 68 and 69 are combined in a series arrangement to also implement an AND Boolean function. Transistors 66 and 68 both have their drains connected together and transistors 67 and 69 both have their sources connected to ground. This arrangement creates a NOR Boolean function. The resultant logic is not ((A and B) or (C and D)). In conventional NMOS logic the drains of transistors 66 and 68 would typically be pulled high with a high impedance transistor. However, this causes at times, depending on the logic inputs, power to be consumed. Dynamic logic instead may have a capacitor to hold the state of the node, such as memcap 70. The memcap 70 can be pre-charged by transistor 62 when its gate PRE input is pulled high along with EVAL input of transistor 64 going low. After memcap 70 is charged, the PRE line can go low along with EVAL going high to allow the transistors 66-69 to discharge memcap 70 if the logic so requires. That is, if not ((A and B) or (C and D)) evaluates to a "zero" then memcap 70 is discharged. If it evaluates to a "one" then memcap 70 stays charged less any leakage over time. Since memcap 70 may be a high quality capacitor over the conventional gate oxide capacitor, less capacitance can be used to hold the charge and accordingly less time may be needed to pre-charge this smaller capacitor allowing for faster clocking and hence faster logic operation.

Consequently, an IC 10 can include a substrate base 11 with a plurality of transistors formed in the substrate base 11. The plurality of transistors may be coupled to a first metal layer 18 formed over the plurality of transistors. A plurality of high dielectric nanometer capacitors 70 may be formed of MSM between the first metal layer 18 and a second metal layer 22 formed over the plurality of high dielectric nanometer capacitors 70. The plurality of high dielectric nanometer capacitors 70 may be configured to operate as memory storage cells in dynamic logic.

Figure 4:
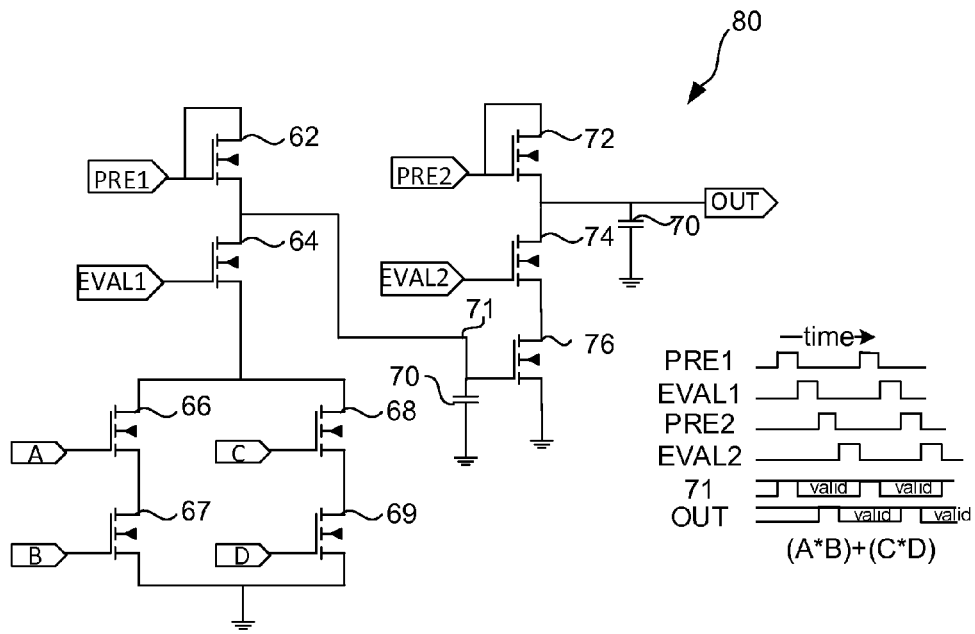
FIG. 4 is an example schematic of a dynamic logic shift register and timing which uses an example memcap.

FIG. 4 is an example schematic of a dynamic logic shift register 80 which may use two example memcaps 70 along with a few additional transistors 72, 74, and 76. Node 71, which was the OUT of FIG. 3, is the input to the gate of transistor 76. Transistor 76 has a drain connected to the source of transistor 74 which has an EVAL 2 input on its gate and its drain may be connected to the source of transistor 72, which has its drain and gate connected to a PRE2 signal. A second memcap 70 may be connected to the source of transistor 72 and the drain of transistor 24 to create a new OUT signal. By appropriate timing of non-overlapping signals for PRE1, EVAL1, PRE2, and EVAL2 (in that order) a signal can be injected to the first memcap 70 in one time period and then moved to the second memcap 70 in a later time period as shown in the timing insert. Also, because transistor 76 performs an invert function, the logic from OUT is (A and B) or (C and D) with a two clock delay.

Figure 5:
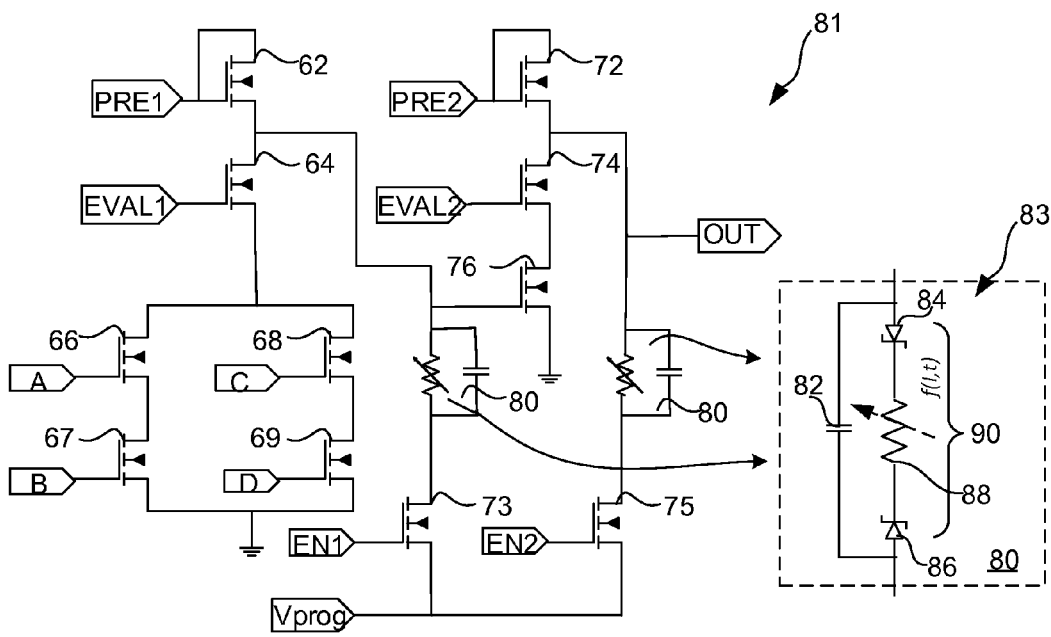
FIG. 5 is an example schematic of a dynamic logic shift register having example memristor based memcaps.

FIG. 5 is another example of a dynamic logic shift register 81 that uses a memristor memcap 80 that can function as a memristor and allow for setting or resetting of the shift register through multiple clock cycles. Memristor memcap 80 can be represented as a capacitor with an adjustable resistor in parallel as shown in FIG. 5. Depending on its construction, memristor memcap 80 can be further described as shown in the inset 83 in FIG. 5.

Memristor memcap 80 can be represented as an equivalent model of a capacitor 82 in parallel with a first Schottky like diode 84 in series with a memristor 88 that may change resistance based on the amount of current over time that passes through it and further in series with a second Schottky like diode 86. The Schottky like diodes 84 and 86 may act as selectors to allow memristor 90 operation of memristor 88 in some voltage regions and to not allow memristor 90 operation in other voltage regions. Memristor 90 resistance may thus be a function of current and time when in the operating voltage region.

One or more memristor memcaps 80 may be connected to a Vprog signal through transistors 73 and 75 as shown. When either EN1 or EN2 or both are "high" the respective transistor 73, 75 can be enabled and Vprog can be supplied to one plate of memristor memcap 80. The other plate of memristor memcap 80 can be pulled to ground or to PRE1 or PRE2, as configured.

Figure 6:
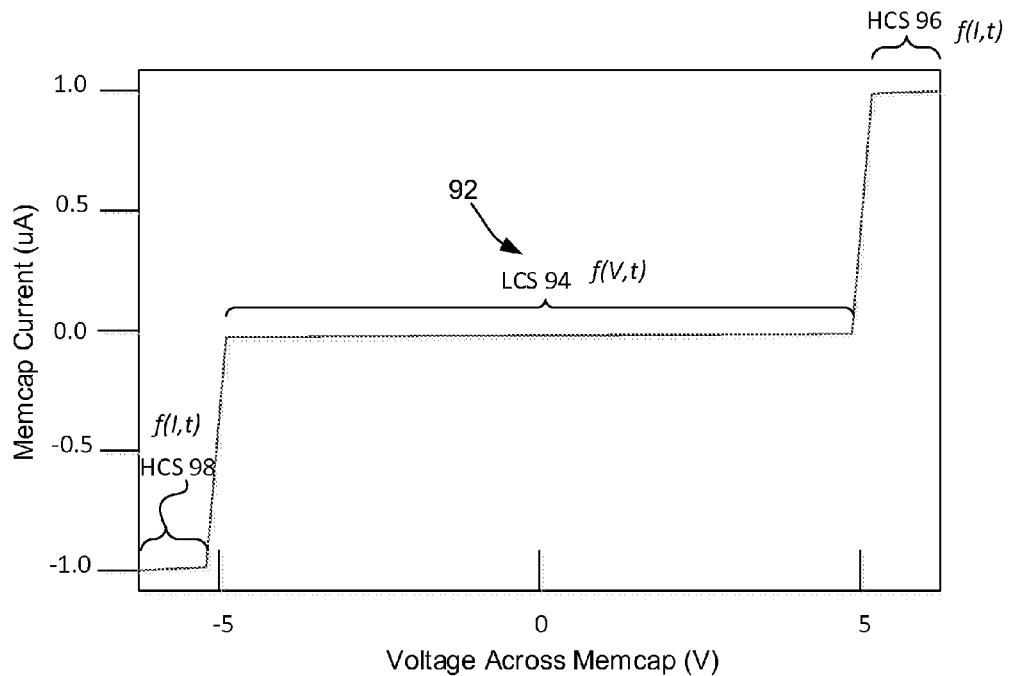
FIG. 6 is an example chart illustrating the voltage—current performance of an example memcap.

FIG. 6 is an example chart illustrating the voltage—current performance 92 of an example memristor memcap 80. In this particular example, the voltage across memristor memcap 80 is shown on the horizontal axis and the current through the memristor memcap 80 is shown on the vertical axis. In a low conductance region (LCS) 94, the Schottky like diodes 84, 86 prevent current flow through memristor 90. In the LCS 94 region, the memristor 90 may be acting as the capacitor 82 with very little leakage current. However, once the voltage across memristor 90 reaches over 5V in this example, then the memristor 90 can be activated and the current flows through memristor 90 and its resistance can be a function of the amount of current over time and if long enough it will eventually saturate at a fixed value. When the voltage across memristor 90 is reduced to less than 5V in this example, the current no longer flows in memristor 90 and it behaves as a capacitor again. When for instance, the polarity across memristor 90 is reversed the capacitor operation continues until another voltage, −5V in this example, is reached. Then the memristor 90 begins to operate as a memristor again but as the current is now negative, the resistance will decrease as time progresses. Accordingly, the capacitor 82 can be charged, discharged, or allowed to operate as a normal capacitor depending on the voltages and signals applied by Vprog, EN1-EN2, and PRE1-PRE2. Thus, if the dynamic shift register 81 is part of a long chain of shift registers and a user wishes to reset (or preset) the registers, this can be done without having to wait for a full set of clock cycles further increasing system performance.

There may be several options to construct memristor memcap 80 depending on the intended use. The memristor memcap 80 may have an active region, MSM 20, disposed between a first capacitor plate 6 and a second capacitor plate 8. The active region may include an un-doped region and a doped region. The un-doped region may include a thin film of a material that can be a dielectric, electronically semi-conducting, nominally electronically insulating, and can also be a weak ionic conductor. The material of the active region may be capable of transporting and hosting ions that act as dopants in order to control the flow of electrons or current (i.e., conductivity) through memristor 88 of memcap 80. On the other hand, the doped region may be composed of mobile dopants that, in certain examples, may be impurity atoms that act as electron donors. Alternatively, in other examples, the mobile dopants can be anion vacancies, which in the active region may be charged and therefore may also be electron donors. In still other examples, the doped region has mobile dopants that may be impurity atoms that act as electron acceptors. More detail on memristor memcap 80 construction and material fabrication is included in the section entitled "Memristor Switch Material Selection" below.

Figure 7A:
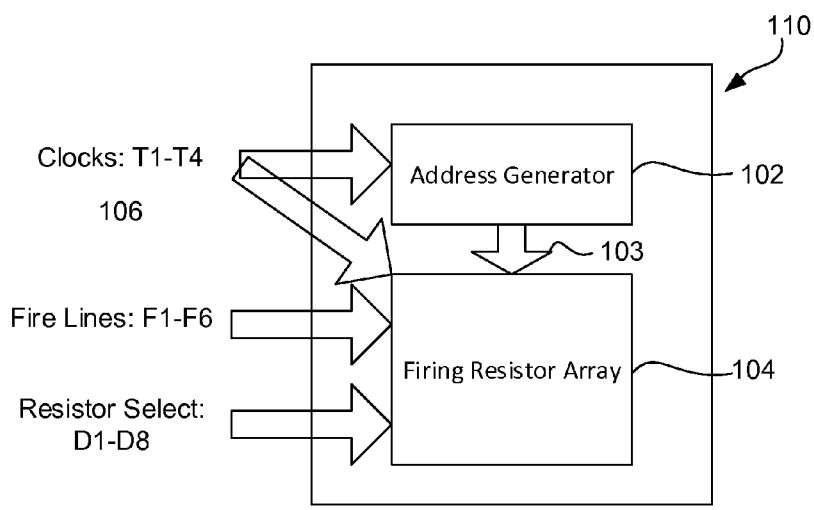
FIG. 7A is an example schematic of printhead controller that implements dynamic logic with memcaps.

FIG. 7A is an example schematic of printhead controller 110 that implements dynamic logic with memcaps 70 or memristor memcaps 80. A set of dynamic shift registers may be chained in series in Address Generator 102 to act as a way to select which resistors in various resistor banks of Firing Resistor Array 104 will fire. The output of Address Generator 102 may be a set of OUT signals from the dynamic shift registers which form the address signals YO(1:13) (FIG.

7B). While 13 signals are shown in this example, the actual number of dynamic shift registers and their respective set of Out signals will vary depending on the particular implementation. The input to the Address Generator 102 and the Firing Resistor Array 104 may be a set of at least four non-overlapping clocks 106, T1-T4. In some examples, there may be additional clocks, such as a fifth and/or sixth clock to allow for additional functionality such as for allowing loading or syncing of the dynamic shift registers. The Firing Resistor Array 104 may have additional control signals such as Fire Lines (F1-F6 in this example) and Resistor Select (D1-D8 in this example) that may have fewer or more signals depending on the size and architecture of the Firing Resistor Array 104. The coupling of the non-overlapping clocks 106, Fire Lines, and Resistor Select allow the printhead resistors to be controlled and fired in a desired sequence. The Fire Line for an associated fire group within the Firing Resistor Array delivers the energy needed to fire a drop of liquid.

Figure 7B:
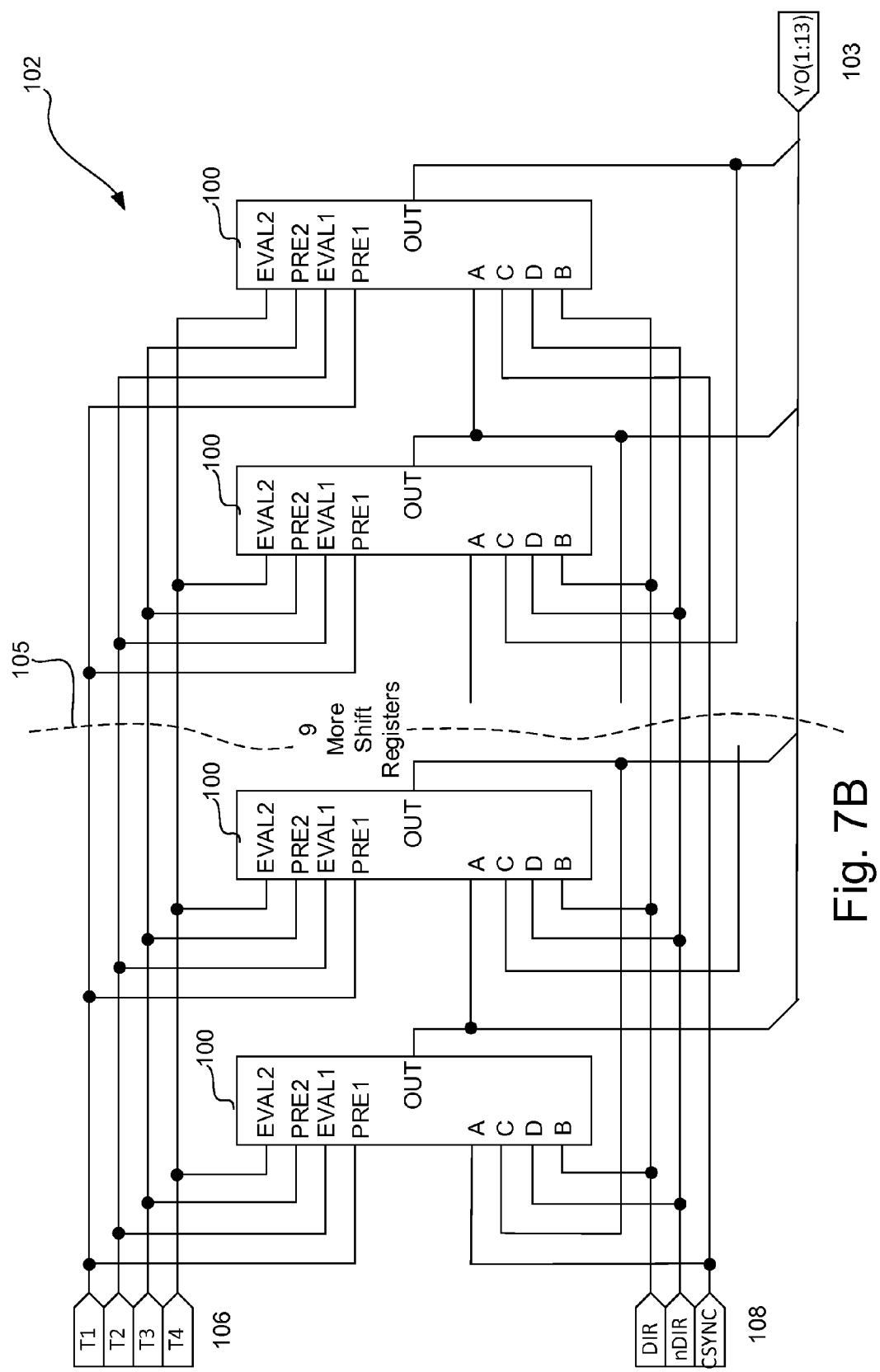
FIG. 7B is an example schematic of a shift register based address generator in the printhead controller of FIG. 7A using dynamic logic.

FIG. 7B is an example schematic of a dynamic logic shift register based Address Generator 102 in the printhead controller of FIG. 7A. In this example, there may be a total of 13 shift registers although only 4 are shown for simplicity and ease of understanding with 9 more shift register left out in break 105. The clock T1 may be connected to the PRE1 of each shift register 100, clock T2 to each EVAL1, clock T3 to each PRE2, and clock T4 to each EVAL2 input. The A inputs of most shift registers 100 may be connected to the OUT of the previous shift register 100, except that the A input of the left most shift register may be connected to the CSYNC signal. The B inputs of most shift registers may be connected to the DIR signal to indicate that printhead may be moving in the forward direction. The C inputs of most shift registers 100 may be connected to the next shift register 100, except that the right most shift register 100 C input may be connected to the CSYNC signal. The D input of the shift registers 100 may be connected to the nDIR signal and indicates that the printhead may be going in the reverse direction. Accordingly, for either the forward or reverse directions, a signal (such as a "one" or "zero") can be loaded into the left or right shift register using the CSYNC signal depending on the printhead going in a forward or reverse direction, respectively, and that signal can be propagated through the remaining shift registers. Assuming an additional CSYNC clock may be used for each forward and reverse direction, then there would be a total of six clocks. Accordingly, then 13×6 or 78 clock signals may be used to load an address into the Address Generator 102 in this example. Since the time to pre-charge the capacitor may be a critical time limitation, being able to have a smaller capacitance due to the less leakage of the memcap 70, 80 can result in a substantial increase in the overall timing of the Address Generator 102 and the Printhead Controller 110.

FIGS. 8A-8F are cross-sections of an example printhead fabrication process 200 that may create an example memcap 70 used in a printhead. For an example process that incorporates the invention, a MOS integrated circuit (IC) with an ejection element 40 can be fabricated with only 7 masks if a substrate bulk contact is not used or 8 masks if a substrate bulk contract is used. To make a complete printhead, the integrated circuit example shown here can be further processed to provide protective layers and an orifice layer on the stack of previously applied thin-film layers. Various methods exist and are known to those skilled in the art to form an orifice layer for particular applications and thus an orifice layer is not shown. For this example process the mask layers labels represent the following major thin-film layers or functions. The masks may be labeled as gate, contact, substrate contact (optional), metal1, metal etch, via, metal2, slope metal etch, and cavitation.

The process begins with a doped silicon substrate 12, for instance a P$^-$ doped substrate for N-MOS, and an N$^-$ doped substrate for PMOS. A first dielectric layer of gate oxide 37 may be applied on the doped substrate 12. In one example, a layer of silicon dioxide may be formed to create the gate oxide 37. Alternatively, the gate oxide can be formed from several layers such as a layer of silicon nitride and a layer of silicon dioxide. Additionally, several different methods of applying the gate oxide are known to those skilled in the art.

Figure 8A:
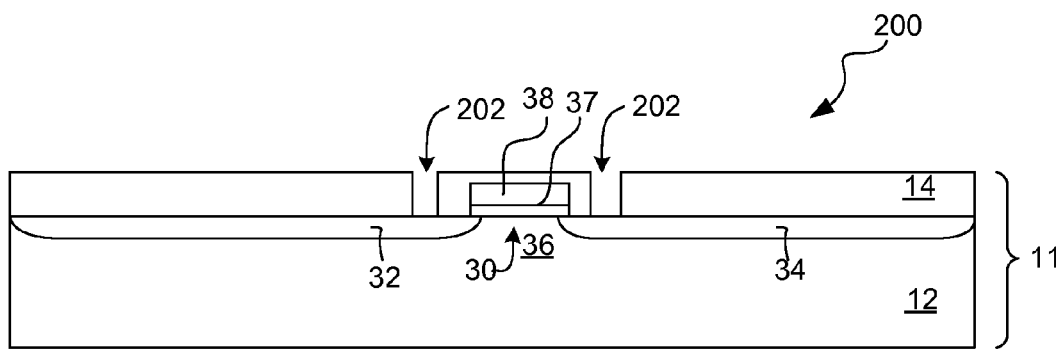
FIGS. 8A-8F are cross-sections of an example printhead fabrication process that creates an example memcap.

In FIG. 8A a substrate base 11 with one or more transistors 30 may be created with substrate 12 and wells 32 and 34 opposite a gate region 36. The gate region 36 has a gate oxide 37 grown or deposited above it and extends into the well regions to minimize channel effects. A polysilicon layer 38 may be deposited onto the gate oxide 37. Next, a first insulating layer 14 of dielectric such as PSG or other undoped oxide may be deposited to cover the transistors 30. The first insulating layer 14 may then be typically planarized and contact openings 202 may be formed by masking and etching the PSG by several well-known techniques.

In more detail, a polysilicon layer 38 may be applied, for instance a deposition of polycrystalline silicon, and patterned with the gate mask and wet or dry etched to form the gate regions from the remaining first conductive layer. A dopant concentration may be applied in the areas of the substrate that is not obstructed by the polysilicon layer 38 to create the active regions (N$^+$ for NMOS, P$^+$ for PMOS) of the transistors. A first insulator layer 14, for instance phosphosilicate glass (PSG) may be applied to a predetermined thickness (at least 2000 Angstroms or more generally between about 6000 to about 12,000 Angstroms or greater) to provide sufficient thermal isolation between a later formed ejection element 40 and the substrate 12. After the PSG is applied, it may be densified. Optionally, before applying the first insulator layer 14, a thin layer of thermal oxide can be applied over the source, drain, and gate of the transistor, such as to a thickness of about 50 to 2,000 Angstroms or for instance 1000 Angstroms. Next, a first set of contact regions 202 may be created in the first insulator layer 14 using the contact mask to form openings to the first conductive layer and/or the active regions of the transistors. Optionally, a second etch step can be used with the optional substrate contact mask to pattern and etch substrate body contacts.

Figure 8B:
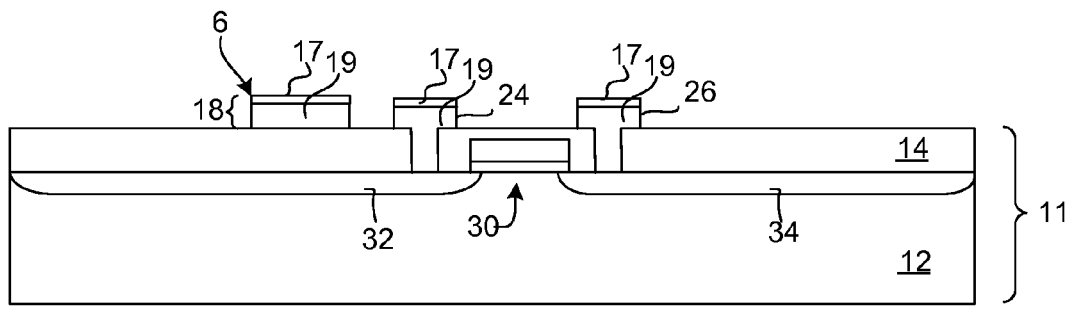

In FIG. 8B, a first metal layer 18 of one or more sub-layers of metal 17, 19 may be deposited on the substrate base 11 and may fill the contact openings 202 with metal to allow contact to the wells 32 and 34, which may be typically the drain and sources of the transistors 30. The first metal layer 18 may then be patterned with a mask and etched to leave contacts 24 and 26 and a first capacitor plate 6 of the memcap 70. Accordingly, the traditional metal mask may be modified to include geometry for leaving the first capacitor plates 6 for each memcap desired. As this change may be just a change in patterning, no additional new mask layer may be required to form the first capacitor plate 6 of the memcap, just a re-layout of the traditional metal1 mask.

Figure 8C:
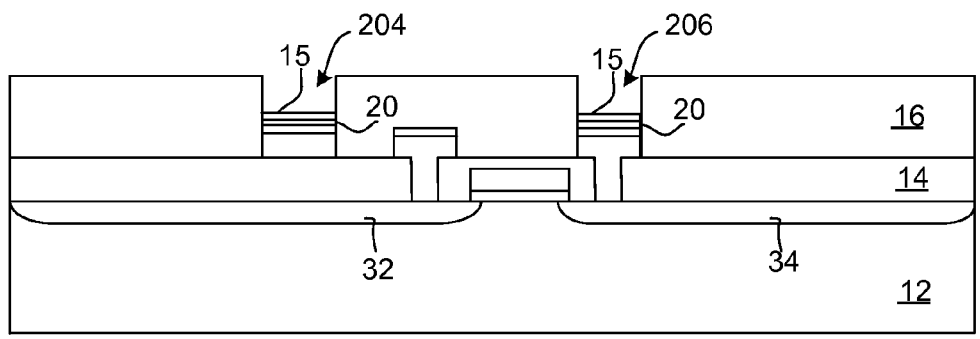

In FIG. 8C, a second insulator layer 16 of one or more insulators, such as a nitride layer and a TEOS layer, may be deposited over contacts 24 and 26, and first capacitor plate 6. The second insulator layer may be planarized or not and then masked and etched to create via openings 204 and 206 to expose the memcap and any vias where the first metal layer 18 may be connected to the second metal layer 22.

Again, this may be a standard mask and etch process step and only the mask pattern of the via mask need be changed to allow for the opening to the memcap. After the openings 204 and 206 have been created, the MSM 20 dielectric may be deposited on top of the first capacitor plate 6 of the memcap and also on the exposed first metal layer 18 in the normal via openings.

At this point, further processing can be done to inject oxide or nitride vacancies into the MSM 20 dielectric. Also, further doping can be done to create selectors to allow for more precise control of a memristor memcap. By appropriate choice of metals, oxides, nitrides, and doping, a range of memcaps can be fabricated depending upon the desired properties for the particular application. Also, a transition layer 15 of metal can be deposited or otherwise applied on the MSM 20 to protect and provide an interface to the second metal layer 22. In one example, an $AlO_x$ growth may be performed over the Al cap layer of first metal layer 18 for MSM 20 and a transition TaAl cap layer may be deposited to begin the formation of the second capacitor plate 8. The transition layer 15, such as the TaAl cap layer deposition, may be a new process step.

Figure 8D:
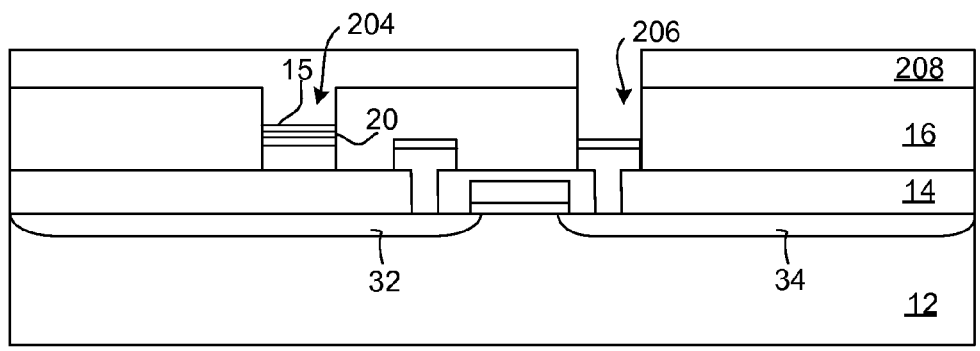

Next, in FIG. 8D, a MSM mask layer 208 may be applied on the substrate and etched to cover the MSM dielectric layer over memcap openings 204 of the memcaps but may leave exposed the traditional via openings 206. This MSM mask layer 208 may be an additional new mask layer for this process. The etching of the MSM layer and the TaAl cap may be a new process step. After the etching is performed the MSM mask layer 208 may be removed.

Figure 8E:
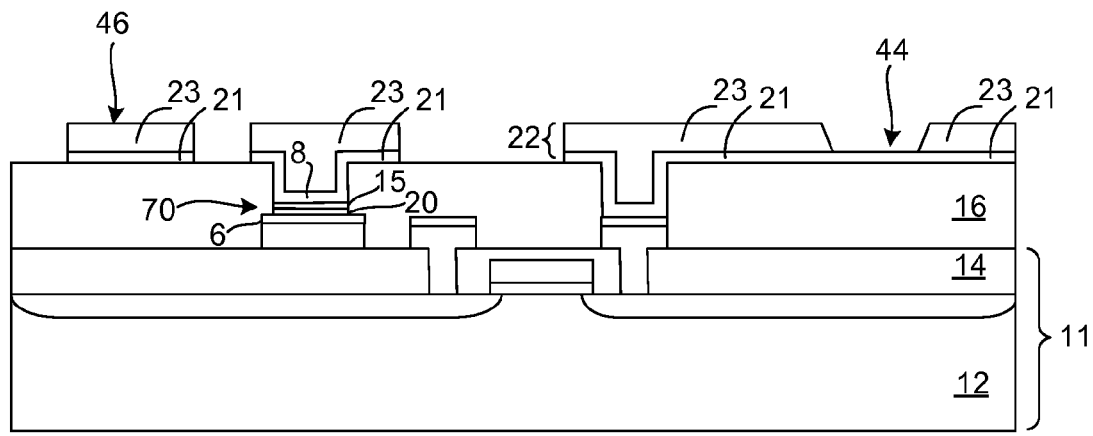

In FIG. 8E, the second metal layer 22 may be deposited to create a second capacitor plate 8 to form memcap 70 and to allow the second metal layer 22 to contact the first metal layer 18. The second metal layer 22 may include one or more layers such as an electrically resistive layer 21 and a high conductive layer 23. The different layers may be deposited and patterned together or separately as desired to create a thin-film resistor 44 using the sloped metal etch mask to etch high conductive layer 23 to expose electrically resistive layer 21 and a bond pad 46 that may be exposed by etching the passivation layer.

In more detail, the second metal layer 22 may include one or more layers of conductive material. For instance, an electrically resistive layer 21 such as tantalum aluminum, may be applied by deposition. Optionally, the electrically resistive layer 21 can be formed of polycrystalline silicon (polysilicon). The electrically resistive layer 21 may be used to create the ejection element 40. A high conductive layer 23, such as aluminum (Al), may be applied, such as by deposition or sputtering. The high conductive layer 23 may be patterned with the metal1 mask and etch to form metal traces for interconnections. The high conductive layer may be used to connect the active regions of the transistors 30 to the ejection elements 40. The high conductive layer may also be used to connect various signals from the first metal layer 18 to active regions.

To convert the integrated circuit to a printhead further steps combine printhead thin-film protective materials. A layer of passivation 13 may be applied over the previously applied layers on the substrate. Using a cavitation mask, the passivation layer 13 may be patterned and etched to create a set of bond pad regions 46 in the passivation layer 13 to the high conductive layer 23. In some examples, the protective passivation layer may be made up of a layer of silicon nitride and a layer of silicon carbide.

Figure 8F:
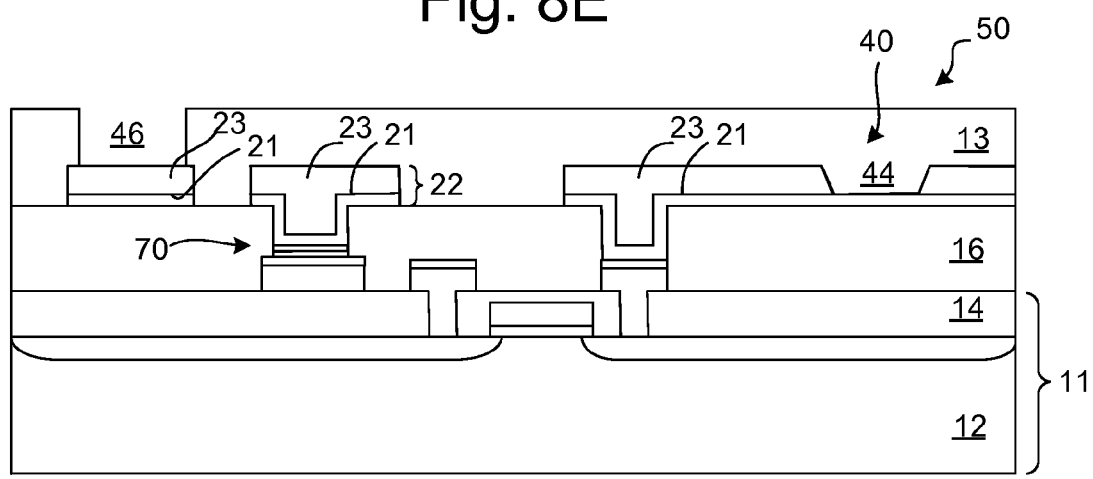

Accordingly, in FIG. 8F, a final passivation layer 13 may be deposited on the processed substrate and masked and etched to expose bond pad 46. The passivation layer 13 may protect printhead 50 from fluid, such as ink, from attacking the thin-film resistor 44 in the ejection element 40.

In summary, a method of forming an integrated circuit may include depositing an insulating layer over a plurality of transistors formed in a substrate interconnected by a first metal layer. The insulating layer may be masked and etched to define a set of vias and a set of areas and locations of a first plate of a plurality of the high-k dielectric nanometer memcaps thereby exposing the first metal layer. A memristor switch material layer may be applied in the etched first insulator layer above the exposed first metal layer to form a nanometer thick layer of high quality dielectric active region. A transition layer of a combination of the first metal layer and a second metal layer may be deposited over the MSM layer. The transition layer and the first MSM layer may be masked and etched to remove the MSM layer and the transition layer within the set of vias and to not remove them in the location for a second plate of the high-k dielectric nanometer capacitors. The second metal layer may be deposited over the transition layer to define the area and location of the second plate.

Memristor Switch Material Selection

The memristor memcap 80 examples illustrated have been limited to the mobile dopants and the fast drift species having a positive charge. In other examples, the dopants and the fast drift species can both be negatively charged and are attracted to positive charges and repelled by negative charges.

Various compositions memristor switch material can be used to create memristor memcap 80. For instance, the active region can be composed of an elemental and/or compound semiconductor. Elemental semiconductors can include silicon (Si), germanium (Ge), and diamond (C). Compound semiconductors can include group IV compound semiconductors, III-V compound semiconductors, and II-VI compound semiconductors. Group IV compound semiconductors can include combinations of elemental semiconductors, such as SiC and SiGe. III-V compound semiconductors can be composed of column IIIa elements selected from boron (B), aluminum (Al), gallium (Ga), and indium (In) in combination with column Va elements selected from nitrogen (N), phosphorus (P), arsenic (As), and antimony (Sb). III-V compound semiconductors can be classified according to the relative quantities of III and V elements. For example, binary compound semiconductors can include, but may not be limited to, BN, BP, BSb, AlP, AlAs, AlSb, GaAs, GaSb, GaP, InN, InP, InAs, and InSb. Ternary compound semiconductors can include, but may not be limited to, InGaP, AlInAs, GaAsN, AlGaN, AlGaP, InGaN, and InAsSb. Ternary compound semiconductors also can include varying quantities of elements, such as $GaAs_yP_{1-y}$ and $InyGa_{1-y}As$, where y ranges from greater than 0 to less than 1. Quaternary compound semiconductors can include, but may not be limited to, AlGaInP, InAlGaP, InGaAlP, AlInGaP, AlGaAsN, InAlAsN. Quaternary compound semiconductors can also include varying quantities of elements, such as $In_xGa_{1-x}As_yP_{1-y}$, where both x and y independently range from greater than 0 to less than 1. Quinary compound semiconductors can include, but may not be limited to, GaInNAsSb and GaInAsSbP. II-VI semiconductors may be composed of column IIb elements selected from zinc (Zn), cadmium (Cd), mercury (Hg) in combination with column VIa elements selected from oxygen (O), sulfur (S), selenium (Se), and tellurium (Te). For example, binary II-VI semiconductors can include, but may not be limited to, CdSe, CdS, CdTe, ZnSe, ZnS, and ZnO.

The active region can be composed of other types of suitable compound semiconductors including II-VI ternary alloy semiconductors, such as CdZnTe, HgCdTe, and HgZnSeI; IV-VI compound semiconductors, such as PbSe, PbS, SnS, and SnTe; and IV-VI ternary compound semiconductors, such as PbSnTe, $Tl_2SnTe_5$, $Tl_2GeTe_5$. The active region can also be composed of a II-V compound semiconductor including, but not limited to, $Cd_3P_2$, $Cd_3As_2$, $Zn_3P_2$, $Zn_3As_2$, and $Zn_3Sb_2$, and other compound semiconductors, such as $Pb_2I$, $MoS_2$, GaSe, SnS, $Bi_2S_3$, PtSi, and $BiI_3$. Semiconductor compounds consisting of some noble metal elements with a high mobility at room temperature, such as Ag, Cu, Au may be especially interesting. The active region can also be composed of a semiconducting nitride or a semiconducting halide. For example, semiconducting nitrides can include AlN, GaN, ScN, YN, LaN, rare earth nitrides, alloys of these compounds, and more complex mixed metal nitrides, and semiconducting halides include CuCl; CuBr, and AgCl.

In other examples, the active region can also be a mixture of the different compound semiconductors described above. The mobile dopant can be an anion vacancy or an aliovalent element. In other examples, the dopants can be p-type impurities, which may be atoms that introduce vacant electronic energy levels called "holes" to the electronic band gaps of the active region. These dopants may be also called "electron acceptors." In still other examples, the dopants can be n-type impurities, which may be atoms that introduce filled electronic energy levels to the electronic band gap of the active region. These dopants may be called "electron donors." For example, boron (B), Al, and Ga may be p-type dopants that introduce vacant electronic energy levels near the valence band of the elemental semiconductors Si and Ge; and P, As, and Sb may be n-type dopants that introduce tilled electronic energy levels near the conduction band of the elemental semiconductors Si and Ge. In III-V compound semiconductors, column VI elements substitute for column V atoms in the III-V lattice and serve as n-type dopants, and column II elements substitute for column III atoms in the III-V lattice to form p-type dopants.

In other examples, the active region can be composed of oxides that contain at least one oxygen atom (O) and at least one other element. In particular, the active region can be composed of titania ($TiO_2$), zirconia ($ZrO_2$), and hafnia ($HfO_2$). These materials may be compatible with silicon (Si) integrated circuit technology because they do not create doping in the Si. Other examples for the active region include alloys of these oxides in pairs or with all three of the elements Ti, Zr, and Hf present. For example, the active region can be composed of $Ti_xZr_yHf_zO_2$, where $x+y+z=1$. Related compounds can include titanates, zirconates, and hafnates. For example, titanates includes $ATiO_3$, where A may represent one of the divalent elements strontium (Sr), barium (Ba) calcium (Ca), magnesium (Mg), zinc (Zn), and cadmium (Cd). In general, the active region can be composed of $ABO_3$, where A may represent a divalent element and B represents Ti, Zr, and Hf. The active region can also be composed of alloys of these various compounds, such as $Ca_aSr_bBa_cTi_xZr_yHf_zO_3$, where $a+b+c=1$ and $x+y+z=1$. There may also be a wide variety of other oxides of the transition and rare earth metals with different valences that may be used, both individually and as more complex compounds. In each case, the mobile dopant can be an oxygen vacancy or an aliovalent element doped into the active region. The oxygen vacancies effectively may act as dopants with one shallow and one deep energy level. Because even a relatively minor nonstoichiometry of about 0.1% oxygen vacancies in $TiO_{2-x}$ can be approximately equivalent to $5 \times 10^{19}$ dopants/$cm^3$, modulating oxygen vacancy profiles have a strong effect on electron transport.

In other examples, the active region can be a sulfide or a selenide of the transition metals with some ionic bonding character, essentially the sulfide and selenide analogues of the oxides described above.

In other examples, the active region can be a semiconducting nitride or a semiconducting halide. For example, semiconducting nitrides include AlN, GaN, ScN, YN, LaN, rare earth nitrides, and alloys of these compounds and more complex mixed metal nitrides, and semiconducting halides include CuCl, CuBr, and AgCl. The active region can be a phosphide or an arsenide of various transition and rare earth metals. In all of these compounds, the mobile dopant can be an anion vacancy or an aliovalent element.

A variety of dopants can be used and may be selected from a group consisting of alkaline earth cations, transition metal cations, rare earth cations, oxygen anions or vacancies, chalcogenide anions or vacancies, nitrogen anions or vacancies, pnictide anions or vacancies, or halide anions or vacancies.

TABLE 2

Example list of MSM material
Exemplary List of Doped, Un-doped, and
Mobile Dopants Composing Compound Materials.

| Un-doped | Doped | Mobile Dopant |
| --- | --- | --- |
| $TiO_2$ | $TiO_{2-x}$ | Oxygen vacancies |
| $ZrO_2$ | $ZrO_{2-x}$ | Oxygen vacancies |
| $HfO_2$ | $HfO_{2-x}$ | Oxygen vacancies |
| $SrTiO_2$ | $SrTiO_{2-x}$ | Oxygen vacancies |
| GaN | $GaN_{1-x}$ | Nitrogen vacancies |
| CuCl | $CuCl_{1-x}$ | Chlorine vacancies |
| GaN | GaN:S | Sulfide ions |

The fast drift ionic species may be selected to have the same charge as the mobile dopant in the example shown here. When the mobile dopant is positively charged, the fast drift species is a positively charged ion. Positively charged fast drift ionic species include, but may not be limited to, hydrogen ion ($H^+$), lithium ion ($Li^+$), sodium ion ($Na^+$), and potassium ion ($K^+$). When the mobile dopant is negatively charged, the fast drift species is a negatively charged ion. Negatively charged fast drift ionic species include, but may not be limited to, fluorine ($F^-$) and chlorine ($Cl^-$). It may also be possible that opposite charges may be selected for the fast drift ionic species and the mobile dopant in some cases.

In addition to the large variety of combinations of semiconductor materials and suitable dopants including the active region, the first and second capacitor plates 6 and 8 can be composed of platinum (Pt), gold (Au), copper (Cu), tungsten (W), aluminum (Al) or any other suitable metal, metallic compound (e.g. some perovskites with or without dopants such as $BaTiO_3$, $Ba_{1-x}La_xTiO_3$, and $PrCaMnO_3$) or semiconductor. The first and second capacitor plates 6 and 8 can also be composed of metallic oxides or nitrides, such as $RuO_2$, $IrO_2$, TaN, WN, and TiN. The capacitor plates 6 and 8 can also be composed of any suitable combination of these materials. For example, in certain examples, the first capacitor plate 6 can be composed of Pt, and the second capacitor plate can be composed Au. In other examples, the first capacitor plate 6 can be composed of Cu, and the second capacitor plate 8 can be composed of $IrO_2$. In still other examples, the first capacitor plate 6 can be composed of a suitable semiconductor, and the second capacitor plate 8 can be composed of Pt.

While the present claimed subject matter has been particularly shown and described with reference to the foregoing examples, those skilled in the art will understand that many variations may be made therein without departing from the scope of the claimed subject matter as defined in the following claims. This description of the claimed subject matter should be understood to include all novel and non-obvious combinations of elements described herein, and claims may be presented in this or a later application to any novel and non-obvious combination of these elements. The foregoing examples have been illustrative, and no single feature or element is essential to all possible combinations that may be claimed in this or a later application. Where the claims recite "a" or "a first" element of the equivalent thereof, such claims should be understood to include incorporation of one or more such elements, neither requiring nor excluding two or more such elements.

What is claimed is:

1. An integrated circuit, comprising:
    a substrate with one or more transistors formed in the substrate, the one or more transistors coupled to a first metal layer formed over the one or more transistors; and
    a plurality of memcapacitors formed of memristor switch material creating an active region between the first metal layer and a second metal layer formed over the plurality of memcapacitors, wherein the plurality of memcapacitors are to operate as memory storage cells in dynamic logic;
    wherein the dynamic logic is to operate as a set of shift registers; and
    wherein the set of shift registers have set/reset functionality by programming the memcapacitors which function as memristors.

2. The integrated circuit of claim 1 wherein the memristor switch material active region is formed of memristor switch elemental or compound semiconductor and doped with mobile dopants to allow for memristor operation.

3. The integrated circuit of claim 1 wherein the dynamic logic is to operate as a set of shift registers.

4. The integrated circuit of claim 1 wherein the plurality of memcapacitors are formed of a stack of first metal oxide and a first metal/second metal transition layer.

5. The integrated circuit of claim 1 wherein the plurality of memcapacitors has a dielectric constant of at least 6.

6. The integrated circuit of claim 1 wherein the plurality of memcapacitors have a thickness less than 100 nanometers.

7. The integrated circuit of claim 1 wherein the plurality of memcapacitors have an area less than 400 micro-meters$^2$.

8. The integrated circuit of claim 1 wherein the one or more transistors are NMOS transistors.

9. The integrated circuit of claim 1, wherein the memristor switch material is formed of memristor switch oxide of the first metal layer and additionally operational as memristors.

10. The integrated circuit of claim 9, further comprising a second number of transistors coupled between respective plurality of memcapacitors and a programming source to allow for programming the memristors.

11. An integrated circuit, comprising:
    a substrate with one or more transistors formed in the substrate, the one or more transistors coupled to a first metal layer formed over the one or more transistors; and
    a plurality of memcapacitors formed of memristor switch material creating an active region between the first metal layer and a second metal layer formed over the plurality of memcapacitors, wherein the plurality of memcapacitors are to operate as memory storage cells in dynamic logic;
    wherein the dynamic logic is to operate as a set of shift registers; and
    wherein the set of shift registers is to control a set of fluid jet resistors.

12. An integrated circuit, comprising: a substrate with a transistor formed in the substrate, the transistor coupled to a first metal layer formed over the transistor; and a memcapacitor formed of memristor switch material creating an active region between the first metal layer and a second metal layer formed over the memcapacitor, the memcapacitor being formed of a stack of first metal oxide and a first metal/second metal transition layer wherein the memcapacitor is a memory storage cell in a dynamic logic circuit, and wherein the dynamic logic circuit is to operate as a set of shift registers; and wherein the dynamic logic circuit operating as a set of shift registers is to control a set of fluid jet resistors.

13. An integrated circuit, comprising: a substrate with a transistor formed in the substrate, the transistor coupled to a first metal layer formed over the transistor and a memcapacitor formed of memristor switch material creating an active region between the first metal layer and a second metal layer formed over the memcapacitor, the memcapacitor being formed of a stack of first metal oxide and a first metal/second metal transition layer wherein the memcapacitor is a memory storage cell in a dynamic logic circuit, and wherein the dynamic logic circuit is to operate as a set of shift registers; and wherein the set of shift registers have set/reset functionality by programming the memcapacitors which act as memristors.

14. A method of forming an integrated circuit, comprising:
    depositing an insulator layer over a number of transistors formed in a substrate interconnected by a first metal layer;
    masking and etching the insulator layer to define a set of vias and a set of areas and locations of a first plate of a plurality of the high-k dielectric nanometer memcaps for dynamic logic thereby exposing the first metal layer;
    applying a memristor switch material (MSM) layer in the etched insulator layer above the exposed first metal layer to form a nanometer thick layer of high quality dielectric material creating an active region;
    depositing a transition layer of a combination of the first metal layer and a second metal layer over the MSM layer;
    masking and etching the transition layer and the MSM layer to remove the transition layer and the MSM layer within the set of vias and to not remove them in the location for a second plate of the high-k dielectric nanometer memcaps; and
    depositing the second metal layer over the transition layer to define the area and location of the second plate.

15. The method of claim 14, further comprising the step of doping the MSM layer active region with material vacancies.

16. The method of claim 15 wherein the applying of the MSM layer is done to a thickness of less than 100 nm.

* * * * *